US008896009B2

(12) United States Patent
Lin et al.

(10) Patent No.: US 8,896,009 B2
(45) Date of Patent: Nov. 25, 2014

(54) LIGHT EMITTING DIODE WITH TWO ALTERNATIVE MOUNTING SIDES FOR MOUNTING ON CIRCUIT BOARD

(71) Applicant: Advanced Optoelectronic Technology, Inc., Hsinchu Hsien (TW)

(72) Inventors: Hsin-Chiang Lin, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/875,296

(22) Filed: May 2, 2013

(65) Prior Publication Data

US 2013/0299866 A1 Nov. 14, 2013

(30) Foreign Application Priority Data

May 14, 2012 (CN) .......................... 2012 1 01475189

(51) Int. Cl.
*H01L 33/00* (2010.01)
*H01L 33/48* (2010.01)
*H01L 33/62* (2010.01)
*H01L 33/60* (2010.01)

(52) U.S. Cl.
CPC ....... *H01L 33/62* (2013.01); *H01L 2224/48247* (2013.01); *H01L 33/486* (2013.01); *H01L 33/60* (2013.01); *H01L 2224/48091* (2013.01)
USPC ......................................................... 257/98

(58) Field of Classification Search
USPC ......................................................... 257/98
See application file for complete search history.

(56) References Cited

U.S. PATENT DOCUMENTS

| 2002/0163006 A1* | 11/2002 | Yoganandan et al. .......... 257/81 |
| 2010/0230700 A1* | 9/2010 | Kim .................................. 257/98 |
| 2010/0230710 A1* | 9/2010 | Kim .................................. 257/99 |
| 2010/0237376 A1* | 9/2010 | Choi ................................. 257/98 |
| 2011/0012151 A1* | 1/2011 | Ono .................................. 257/98 |
| 2011/0031513 A1* | 2/2011 | Hsieh et al. ..................... 257/88 |
| 2011/0031526 A1* | 2/2011 | Han et al. ........................ 257/99 |
| 2011/0042699 A1* | 2/2011 | Park et al. ....................... 257/98 |

FOREIGN PATENT DOCUMENTS

JP 2007-214474 A 8/2007
JP 2012-28630 A 2/2012

* cited by examiner

*Primary Examiner* — Lex Malsawma
(74) *Attorney, Agent, or Firm* — Novak Druce Connolly Bove + Quigg LLP

(57) ABSTRACT

An exemplary light-emitting diode (LED) includes a substrate, a first electrode and a second electrode sandwiching the substrate therebetween, an LED chip electrically connected to the first electrode and the second electrode, a reflector located on the first electrode and the second electrode and surrounding the LED chip, and a first retaining wall mounted on an edge of the first electrode and a second retaining wall mounted on an edge of the second electrode. The first retaining wall and the second retaining wall are made of conductive material. The first retaining wall and the second retaining wall are at a same side of the LED. Outer surfaces of the first retaining wall and the second retaining wall are exposed out of the reflector.

12 Claims, 4 Drawing Sheets

LIGHT EMITTING DIODE WITH TWO ALTERNATIVE MOUNTING SIDES FOR MOUNTING ON CIRCUIT BOARD

BACKGROUND

1. Technical Field

The present disclosure relates to LEDs (light-emitting diodes), and more particularly, to an LED capable of being mounted to a component such as a circuit board in either of two selectable orientations.

2. Description of Related Art

Even as a relatively new type of light source, LEDs are now widely used in various applications. A conventional LED includes a base defining a cavity therein, a pair of electrodes fixed in the base, a light emitting chip received in the cavity to electrically connect the two electrodes, and an encapsulant filling the cavity to seal the chip. Generally, each of the two electrodes has a protruding end exposed at a bottom of the base.

However, because the two electrodes are exposed only at the bottom of the base, the LED is limited to being mounted on a circuit board in only a single orientation, namely, bottom side down. That is, the LED is vertically mounted on the circuit board, and a light output direction of the LED is thus typically limited to being perpendicular to the circuit board.

What is needed, therefore, is an LED which can overcome the limitations described above.

DETAILED DESCRIPTION

Embodiments of the LED of the present disclosure will now be described in detail below and with reference to the drawings.

Figure 1:
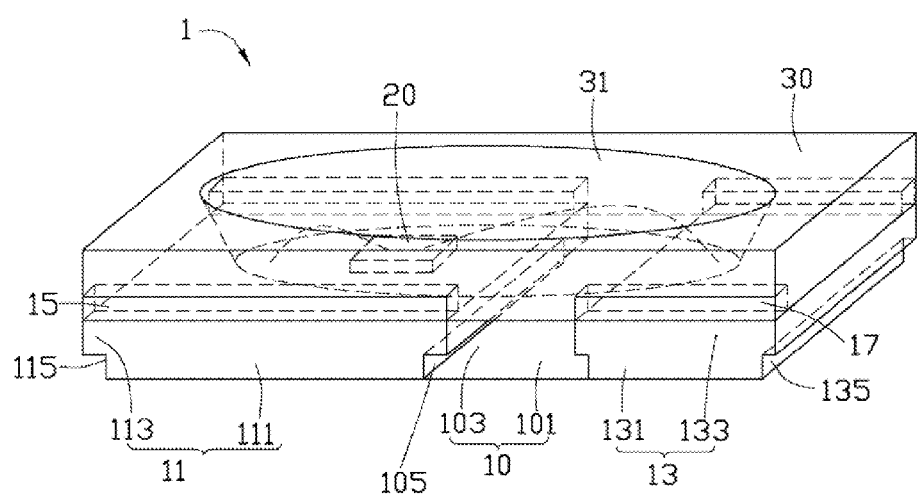
FIG. 1 is a perspective view of an LED according to an exemplary embodiment of the present disclosure.

Referring to FIG. 1, an LED 1 according to an exemplary embodiment of the present disclosure includes a substrate 10, a first electrode 11 and a second electrode 13 sandwiching the substrate 10, a pair of first retaining walls 15 mounted on a top surface of the first electrode 11, a pair of second retaining walls 17 mounted on a top surface of the second electrode 13, an LED chip 20 electrically connecting the first electrode 15 and the second electrode 17, and a reflector 30 surrounding the LED chip 20 and covering the first retaining walls 15 and the second retaining walls 17.

Figure 2:
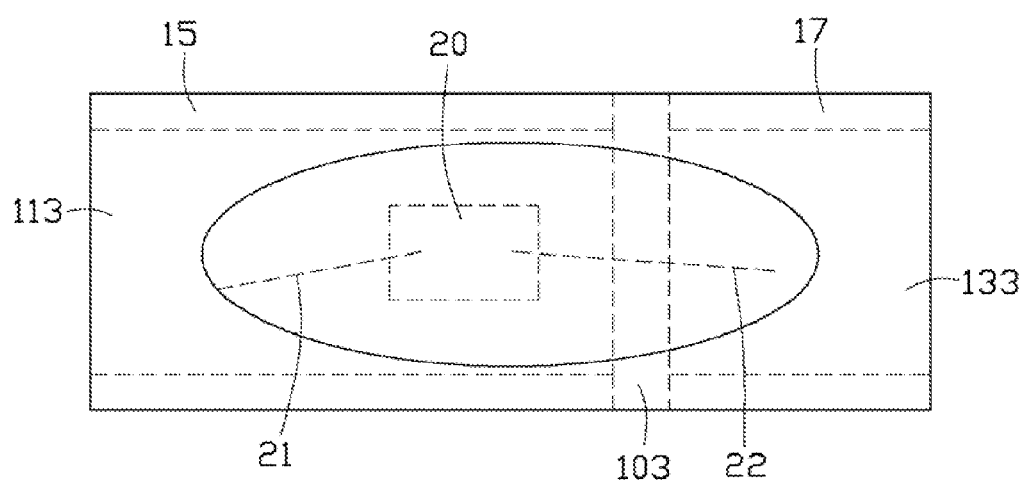
FIG. 2 is a top plan view of the LED of FIG. 1.

Referring also to FIG. 2, the substrate 10 is a plate made of insulating material. The substrate 10 extends longitudinally along a transverse direction of the LED 1. The substrate 10 includes a substrate main body 101 and a rectangular protruding part 103 extending vertically from a center of a top of the substrate main body 101. The protruding part 103 is integrally formed with the substrate main body 101 as a single monolithic piece. A length of the substrate main body 101 and a length of the protruding part 103 are both the same as a length of the substrate 10. A width of the protruding part 103, that is, a size along a longitudinal direction of the LED 1, is smaller than that of the substrate main body 101. Two opposite front and rear end faces of the protruding part 103 are coplanar with two opposite front and rear end faces of the substrate main body 101, respectively. As such, a front side view of the substrate 10 (as viewed in FIG. 1) represents an approximately inverted "T" shape.

With the above-described configuration, a step part 105 is formed in a left side of the substrate 10 where the substrate main body 101 is exposed from the protruding part 103, and another step part 105 is formed in a right side of the substrate 10 where the substrate main body 101 is exposed from the protruding part 103. The two step parts 105 of the substrate 10 are in the shape of two elongate beams. In this embodiment, each step part 105 has an elongate horizontal surface, and an elongate vertical surface extending down from the horizontal surface. The horizontal and vertical surfaces of the step part 105 cooperatively define an approximate "L" shape. The two step parts 105 are assembled with the first electrode 11 and the second electrode 13, respectively (see also below).

The first electrode 11 is a metallic sheet, and adjoins a left side of the substrate 10. The first electrode 11 includes a first main body 111, and a first supporting part 113 extending from a top of the first main body 111. The first main body 111 and the first supporting part 113 are rectangular-shaped. A width of the first supporting part 113 along the longitudinal direction of the LED 1 is larger than that of the first main body 111, with the first main body 111 located at a center of a bottom surface of the first supporting part 113. Two opposite front and rear end faces of the first main body 111 are coplanar with two opposite front and rear end faces of the first supporting part 113, respectively. As such, a front side view of the first electrode 11 (as viewed in FIG. 1) represents an approximate "T" shape.

With the above-described configuration, a first mortised part 115 is formed in a left side of the first electrode 11, and another first mortised part 115 is formed in a right side of the first electrode 11. Each first mortised part 115 includes an elongate portion of the bottom surface of the first supporting part 113 which is exposed, and an elongate vertical surface of the first main body 111 extending down from the elongate portion of the bottom surface of the first supporting part 113. The elongate portion of the bottom surface of the first supporting part 113 and the elongate vertical surface of the first main body 111 cooperatively define an approximate "L" shape. The first mortised part 115 at the right side of the first electrode 11 is used to assemble with the step part 105 at the left side of the substrate 10.

In this embodiment, the second electrode 13 has a structure similar to that of the first electrode 11. The difference is that a size of the second electrode 13 is smaller than that of the first electrode 11. That is, a width of the second electrode 13 along the longitudinal direction of the LED 1 is smaller than that of the first electrode 11. Alternatively, a size of the second electrode 13 can be substantially equal to that of the first electrode 11.

In detail, the second electrode 13 includes a second main body 131, and a second supporting part 133 extending from a top of the second main body 131. The second main body 131 and the second supporting part 133 are rectangular-shaped. A width of the second supporting part 133 along the longitudinal direction of the LED 1 is larger than that of the second main body 131, with the second main body 131 located at a center of a bottom surface of the second supporting part 133. Two opposite front and rear end faces of the second main body 131 are coplanar with two opposite front and rear end faces of the second supporting part 133, respectively. As such, a front side view of the second electrode 13 (as viewed in FIG. 1) represents an approximate "T" shape.

With the above-described configuration, a second mortised part 135 is formed in a left side of the second electrode 13, and another second mortised part 135 formed in a right side of the second electrode 13. Each second mortised part 135 includes an elongate portion of the bottom surface of the second supporting part 133 which is exposed, and an elongate vertical surface of the second main body 131 extending down from the elongate portion of the bottom surface of the second supporting part 133. The elongate portion of the bottom surface of the second supporting part 133 and the elongate vertical surface of the second main body 131 cooperatively define an approximate "L" shape. The second mortised part 135 at the left side of the second electrode 13 is used to assemble with the step part 105 at the right side of the substrate 10.

When assembling the first electrode 11 and the second electrode 13 with the substrate 10, the substrate 10 is sandwiched by the first electrode 11 and the second electrode 13. In particular, the step part 105 at the left side of the substrate 10 is assembled with the first mortised part 115 at the right side of the first electrode 11, and the step part 105 at the right side of the substrate 10 is assembled with the second mortised part 135 at the left side of the second electrode 13. The two opposite front and rear end faces of the first electrode 11 and the two opposite front and rear end faces of the second electrode 13 are coplanar with the two opposite end faces of the substrate 10. A top surface of the substrate 10 is coplanar with the top surfaces of the first electrode 11 and the second electrode 13, respectively.

The first mortised part 115 of the first electrode 11 and the second mortised part 135 of the second electrode 13 are assembled with the step parts 105 of the substrate 10, respectively. With such engagements, a contact area of the first electrode 11 with the substrate 10 is increased, and a contact area of the second electrode 13 with the substrate 10 is increased. Accordingly, the first electrode 11, the second electrode 13 and the substrate 10 are firmly combined together.

Furthermore, because the substrate 10 is sandwiched between the first electrode 11 and the second electrode 13, this helps ensure good airtightness of the LED 1.

Each first retaining wall 15 is bar-shaped and made of electrically conductive material. The two first retaining walls 15 are located on the top surface of the first electrode 11, and are spaced from each other. The two first retaining walls 15 extend along front and rear edges of the top surface of the first electrode 11 along the longitudinal direction of the LED 1, respectively. An outer face of each first retaining wall 15 is coplanar with the corresponding front or rear end face of the first supporting part 113 of the first electrode 11. In this embodiment, a left end face of each first retaining wall 15 is coplanar with a left end face of the first supporting part 113. Alternatively, the first retaining walls 15 can be formed integrally with the first electrode 11 as a single monolithic piece.

Each second retaining wall 17 is similar to each first retaining wall 15. The difference between the first retaining wall 15 and the second retaining wall 17 is that a length of each second retaining wall 17 is shorter than that of each first retaining wall 15.

The two second retaining walls 17 are located on the top surface of the second electrode 13, and are spaced from each other. The two second retaining walls 17 extend along front and rear edges of the top surface of the second electrode 17 along the longitudinal direction of the LED 1, respectively. The second retaining wall 17 and the first retaining wall 15 at the front side of the LED 1 are aligned with each other, and the second retaining wall 17 and the first retaining wall 15 at the rear side of the LED 1 are aligned with each other.

An outer face of each second retaining wall 17 is coplanar with the corresponding front or rear end face of the second supporting part 133 of the second electrode 17. In this embodiment, a right end face of each second retaining wall 17 is coplanar with a right end face of the second supporting part 133. Alternatively, the second retaining walls 17 can be formed integrally with the second electrode 13 as a single monolithic piece.

Figure 3:
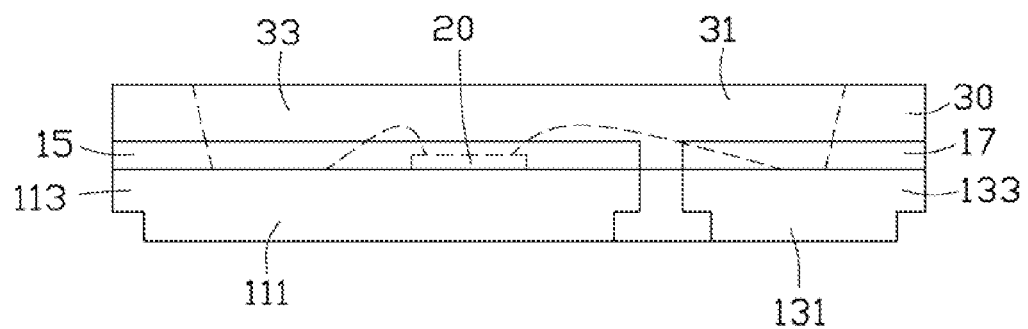
FIG. 3 is a side view of the LED of FIG. 1.

Also referring to FIG. 3, the LED chip 20 is mounted on the top surface of the first electrode 11 and located between the separate first retaining walls 15. The LED chip 20 is electrically connected with the first electrode 11 and the second electrode 13 by wires 21, 22, respectively. Alternatively, the LED chip 20 may be mounted on the top surface of the second electrode 13, or may be mounted on the top surface of the substrate 10.

The reflector 30 is rectangular, and covers the top surfaces of the first and second electrodes 11, 13, the first retaining walls 15 and the second retaining walls 17. As such, the reflector 30, the substrate 10, the first electrode 11 and the second electrode 13 are combined together firmly. The front (outer) faces of the front first retaining wall 15 and the front second retaining wall 17 are coplanar with a front face of the reflector 30. The rear (outer) faces of the rear first retaining wall 15 and the rear second retaining wall 17 are coplanar with a rear face of the reflector 30. Thus the front faces of the front first and second retaining walls 15, 17 are exposed at the front face of the reflector 30, and the rear faces of the rear first and second retaining walls 15, 17 are exposed at the rear face of the reflector 30. The left end faces of the first retaining walls 15 are coplanar with and exposed at a left side face of the reflector 30, and the right end faces of the second retaining walls 17 are coplanar with and exposed at a right side face of the reflector 30.

The reflector 30 is made of epoxy resin, silicone resin, or polyphtalamide. A through hole 31 is vertically defined in a center of the reflector 30. A bottom end and a top end of the through hole 31 are oval-shaped. A size of the through hole 31 tapers from the top end to the bottom end. The LED chip 20 is located on the top surface of first electrode 11 at the bottom end of the through hole 31. Alternatively, an encapsulant (not shown) with phosphor powder (not shown) can be filled in the through hole 31.

Light beams emitting from the LED chip 20 to a periphery of the LED 1 may be reflected and concentrated by an inner surface of the through hole 31 to emit out from the top end of the through hole 31. That is, the through hole 31 can increase the light output efficiency of the LED 1.

Figure 4:
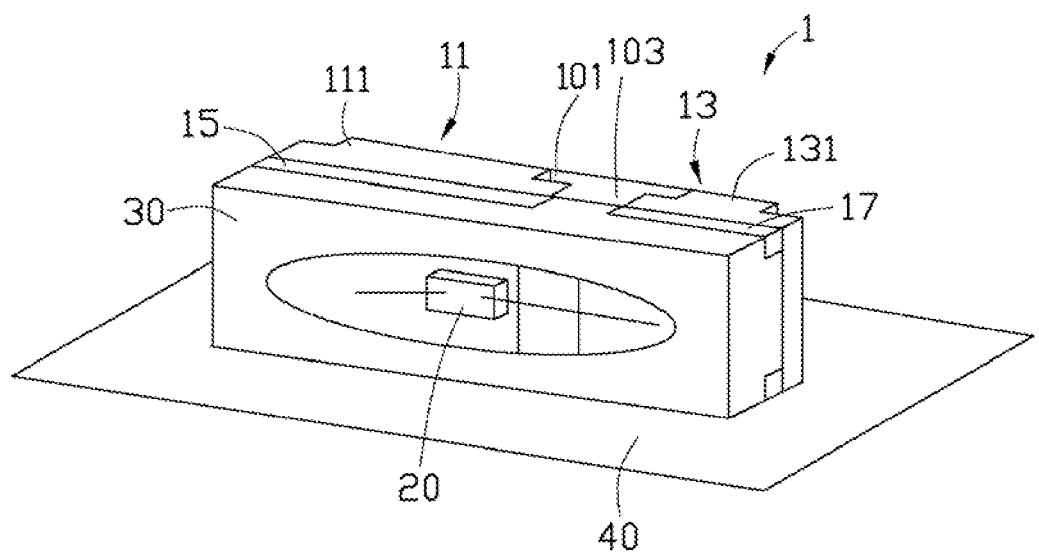
FIG. 4 is a perspective view of the LED of FIG. 1 turned 90° and mounted on a circuit board.

Referring to FIG. 4, the LED 1 is mounted to a circuit board 40. Since the front faces of the first and second retaining walls 15, 17 are exposed at the front face of the reflector 30 and are connected to the circuit board 40, a contact area between the LED 1 and the circuit board 40 is increased. This means the LED 1 and the circuit board 40 are more firmly connected together. In addition, the heat dissipating area for heat transfer from the LED 1 to the circuit board 40 is increased.

Furthermore, when the LED 1 is mounted on the circuit board 40 front side down as described above, many parts of the first electrode 11 and many parts of the second electrode 13 are not connected the circuit board 40 and are exposed to ambient air. This allows heat generated from the LED 1 to be rapidly dissipated into the air. Moreover, many parts of the circuit board 40 are also exposed to ambient air. This allows heat generated from the circuit board 40 to be rapidly dissipated into the air.

Alternatively, the LED 1 may be mounted on the circuit board 40 by the bottom surfaces of the first main body 111, the substrate main body 101 and the second main body 131.

In summary, the LED 1 may be mounted on the circuit board 40 front side down or bottom side down. The exposed front faces of the first and second retaining walls 15, 17 enable the LED 1 to be mounted front side down. The exposed rear faces of the first and second retaining walls 15, 17 enable the LED 1 to be mounted rear side down (not shown). The bottom surfaces of the first main body 111, substrate main body 101 and second main body 131 enable the LED 1 to be mounted bottom side down (not shown).

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode (LED) comprising:
a substrate;
a first electrode and a second electrode sandwiching the substrate therebetween;
an LED chip electrically connected to the first electrode and the second electrode;
a reflector located on the first electrode and the second electrode and surrounding the LED chip; and
an electrically conductive first retaining wall mounted on an edge of the first electrode and a second retaining wall mounted on an edge of the second electrode, the first retaining wall and the second retaining wall being made of electrically conductive material, the first retaining wall and the second retaining wall being at a same side of the LED, outer faces of the first retaining wall and the second retaining wall being exposed from the reflector;
wherein the outer face of the first retaining wall is coplanar with a corresponding side face of the first electrode, and the outer face of the second retaining wall is coplanar with a corresponding side face of the second electrode.

2. The LED of claim 1, wherein another first retaining wall is mounted on an opposite edge of the first electrode, and another second retaining wall is mounted on an opposite edge of the second electrode.

3. The LED of claim 2, wherein outer faces of the another first retaining wall and the another second retaining wall are coplanar with a corresponding side face of the first electrode and a corresponding side face of the second electrode, respectively, and are exposed from the reflector.

4. The LED of claim 1, wherein the first retaining wall is formed integrally with the first electrode as a single monolithic piece, and the second retaining wall is formed integrally with the second electrode as a single monolithic piece.

5. The LED of claim 1, wherein the reflector covers a top surface of the substrate, a top surface of the first electrode, a top surface of the second electrode, the first retaining wall and the second retaining wall.

6. The LED of claim 1, wherein the substrate includes a substrate main body and a rectangular protruding part extending vertically from a center of a top of the substrate main body, such that a side view of the substrate represents an approximately inverted "T" shape.

7. The LED of claim 6, wherein the first electrode includes a first main body and a first supporting part extending from a top of the first main body, such that a side view of the first electrode represents an approximately "T" shape, and the second electrode includes a second main body and a second supporting part extending from a top of the second main body, such that a side view of the second electrode represents an approximately "T" shape.

8. The LED of claim 7, wherein two opposite end faces of the first electrode and two opposite end faces of the second electrode are coplanar with two opposite end faces of the substrate, respectively.

9. The LED of claim 8, wherein a top surface of the substrate is coplanar with a top surface of the first electrode and a top surface of the second electrode.

10. A light emitting diode (LED) comprising:
a substrate;
a first electrode and a second electrode sandwiching the substrate therebetween;
an LED chip electrically connected to the first electrode and the second electrode, respectively; and
a reflector covering a top surface of the substrate, a top surface of the first electrode and a top surface of the second electrode,
wherein an electrically conductive first retaining wall is provided on an edge of the first electrode with the first electrode and the first retaining wall integrally formed as a single monolithic piece, a second retaining wall is provided on an edge of the second electrode with the second electrode and the second retaining wall integrally formed as a single monolithic piece, the first retaining wall and the second retaining wall are located at a same side of the LED, and side faces of the first electrode and the second electrode are exposed from the reflector;
wherein outer surfaces of the first retaining wall and the second retaining wall are exposed out of the reflector, respectively; and
wherein the outer surface of the first retaining wall is coplanar with the corresponding side surface of the first electrode, and the outer surface of the second retaining wall is coplanar with the corresponding side surface of the second electrode.

11. The LED of claim 10, wherein another first retaining wall is formed on the opposite edge of the first electrode, another second retaining wall is formed on opposite edge of the second electrode, and the outer surfaces of another first retaining wall and another second retaining wall are exposed out of the reflector.

12. A circuit board assembly comprising:
a circuit board; and
a light-emitting diode (LED), comprising:
a substrate;
a first electrode and a second electrode sandwiching the substrate therebetween;
an LED chip electrically connected to the first electrode and the second electrode;
a reflector located on the first electrode and the second electrode and surrounding the LED chip;
a first retaining wall mounted on an edge of the first electrode, the first retaining wall being made of electrically conductive material; and
a second retaining wall mounted on an edge of the second electrode, the second retaining wall being made of electrically conductive material;
the first retaining wall and the second retaining wall being at a same side of the LED, outer faces of the first retaining wall and the second retaining wall being exposed out of the reflector and facing and electrically connected to the circuit board;
wherein the outer surface of the first retaining wall is coplanar with a corresponding side surface of the first electrode, and the outer surface of the second retaining wall is coplanar with a corresponding side surface of the second electrode.

\* \* \* \* \*